United States Patent [19]
Jaw

[11] Patent Number: 6,040,794
[45] Date of Patent: Mar. 21, 2000

[54] HIGH-SPEED ANALOG-TO-DIGITAL CONVERTER

[75] Inventor: Jerry Jaw, Hsinchu Hsien, Taiwan

[73] Assignee: United Microelectronics Corp., Taiwan

[21] Appl. No.: 09/060,427

[22] Filed: Apr. 14, 1998

[30]     Foreign Application Priority Data

Dec. 19, 1997  [TW]  Taiwan .................................. 86221135

[51] Int. Cl.⁷ .................................................. H03M 1/12
[52] U.S. Cl. ........................................... 341/155; 341/154
[58] Field of Search .................................. 341/155, 154, 341/160, 161, 163

[56]     References Cited

U.S. PATENT DOCUMENTS

| | | | |
|---|---|---|---|
| 4,755,793 | 7/1988 | Neidorff | 341/163 |
| 4,987,417 | 1/1991 | Buckland | 341/159 |
| 4,989,004 | 1/1991 | Kanayama | 341/161 |
| 5,184,131 | 2/1993 | Ikeda | 341/165 |
| 5,194,867 | 3/1993 | Fisher | 341/159 |
| 5,493,300 | 2/1996 | Eiler et al. | 341/154 |

*Primary Examiner*—Howard L. Williams
*Assistant Examiner*—Peguy JeanPierre
*Attorney, Agent, or Firm*—Blakely Sokoloff Taylor & Zafman

[57]     ABSTRACT

An A/D converter that settles the converted digital result requiring no timing signal for synchronously-triggered conversion operation is disclosed. The A/D converter converts analog signals into digital signals in a limited number of rippling feedback operations in short time delay periods utilizing a simple circuit configuration that includes a network of parallel comparators. Each of the comparators is fed with a corresponding voltage reference supply by a resistor network. Each of the resistor networks includes series connections of resistors and a corresponding switch means that reflects the status of a determined data bit of the converted data. The circuitry configuration is relatively simply in structure and settles to a converted digital data in short periods of time that requires no synchronizing clock signal.

6 Claims, 6 Drawing Sheets

HIGH-SPEED ANALOG-TO-DIGITAL CONVERTER

CROSS-REFERENCE TO RELATED APPLICATION

This application claims the priority benefit of Taiwan application serial no. 86221135, filed Dec. 19, 1997, the full disclosure of which is incorporated herein by reference.

BACKGROUND OF THE INVENTION

1. Field of the Invention

This invention relates in general to an analog-to-digital (A/D) converter and, in particular, to an A/D converter requiring no timing signal for synchronously-triggered conversion operation. More particularly, this invention relates to an A/D converter that converts analog signals into digital in a limited number of rippling feedback operations in short time delay periods utilizing simple circuit configuration.

2. Description of Related Art

Conventional A/D converters employ one of three methods to perform the analog-to-digital conversion of signal. A slow A/D converter based on a first A/D conversion method employs a digital counter that is used to count through a range of guess values, which are converted by a digital-to-analog converter for comparison with the input analog signal. The digitally-converted data with the closest comparison result is obtained as the conversion result. A relatively higher-speed A/D converter based on a second A/D conversion method employs a multiple of $2^n$ comparators to implement its conversion. The voltage of the input analog signal is divided into $2^n$ divisions that may have their voltage determined. An encoder is then employed to obtain the digitally-converted result based on the determined voltage. Another high-speed A/D converter based on a third A/D conversion method employs a logical scheme to set the data code, which, after its D/A conversion, is then compared with the input analog data, with the comparison result fed back to the logic circuitry for modification of the data code for output as the converted A/D result.

FIG. 1 is a schematic diagram showing the circuitry of a conventional low-speed A/D converter. For example, assume an up-counter 12 is preset to an initial value of 0. The counter value present at the Q outputs of the up-counter 12 is relayed to the D/A converter 11 which is then converted into analog data and compared with the analog input $V_{in}$ in the comparator 10. The result of comparison at the comparator 10 is sent to the two-input AND gate 13 for determining whether or not the up-counter 12 should cease its counting. This is determined by the AND gate 13, which allows the counter 12 to be triggered for one up-count when the clock signal Clk is ANDed with a logical zero output signal from the comparator 10. In other words, when the comparator 10 has a logical one output signal, which reflects the fact that both the comparator inputs are found equal, the AND gate 13 no longer relays the up-counting clock signal Clk to trigger the counter 12 for further up-counting. At this instance, the Q outputs of the up-counter 12 are the digital equivalent of the input analog signal $V_{in}$. The clear input Clear allows the counter 12 to reset for initiation of another A/D conversion cycle. The A/D converter based on the circuitry of FIG. 1 is characterized by its slow speed in obtaining its conversion result. Up to $2^n$ clock cycles may be required to conclude one conversion operation.

The circuitry of FIG. 2 depicts another conventional converter for A/D conversion that operates at relatively higher speed. In comparison with the circuitry of FIG. 1, this is substantially a comparator-based A/D converter circuitry based on a series of discrete converters 20 arranged in a parallel network. The input signal $V_{in}$ is input to all the positive input terminals of the eight comparators 20, while a maximum input comparator signal supplied by a reference source is divided among a series train of eight resistors R1, R2, ..., and R8, with each division successively input to the negative input terminal of the eight corresponding comparators 20. Each of the eight comparators then performs its compare operation and relays its compared result to the corresponding one of the eight inputs of a priority encoder 21. Based on the inputs, the priority encoder 21 produces an output at its Q terminals representing the specific one of the eight comparators that delivers a matched comparison result. In this depicted example, three Q output bits $Q_2$, $Q_1$ and $Q_0$ are required to represent the eight input bits $0, 1, \ldots, 7$. In case there are more than one matched input among the eight, the encoder 21 is designed to select the one that has an assigned higher priority as the determined output. This circuitry, although able to perform much faster than the circuitry of FIG. 1, requires more independent comparators to operate. In general, a total of $2^n$ comparators will be required for a resolution of n bits in the converted result. In the depicted example, a total of eight compared to one in the circuitry of FIG. 1 are required. When there is a requirement for higher resolution, increased circuitry complexity becomes necessary, and the cost increases as a result.

FIG. 3 is schematic diagram of another conventional high-speed A/D converter employing a controlling logic circuitry 32, which generates an initial value that is relayed to the D/A converter 31 via a switch unit 33. The D/A converter 31 converts the digital value produced by the controlling logic circuitry 32 into an analog signal that is then relayed to a comparator 30 for comparison with the input analog signal $V_{in}$. The comparator sends its compared result back to the controlling logic circuitry 32, which then adjusts its generated value for another cycle of comparison, until a match is finally reached. Two primary time delays arise in this system. One is that required for the processing time in the controlling logic circuit 32, and the other is that required for the comparator 30 to perform its comparison. Assuming a three-bit A/D conversion, a 100 ns delay time is required for both the two primary delays. A total of 3×100 ns×2=600 ns is required. When the conversion resolution is high, the total conversion time increases proportionally.

Thus, it is apparent that these conventional A/D converters suffer the disadvantages of either slow operation time or complicated circuitry configuration, or both.

SUMMARY OF THE INVENTION

It is therefore an object of the present invention to provide an A/D converter that converts analog signal to digital signal, requiring no timing signal for synchronously-triggered conversion operation.

It is another object of the present invention to provide an A/D converter that converts analog signals into digital in a limited number of rippling feedback operations in short time delay periods utilizing simple circuit configuration.

The present invention achieves the above-identified objects by providing an analog-to-digital converter for converting an input analog signal into an n-bit digital data represented by binary data bits $Q_{n-1}, Q_{n-2}, \ldots, Q_0$, wherein $Q_{n-1}$ is the most significant bit and $Q_0$ the least. The converter includes a number of n reference voltage supply circuits, each generating a corresponding reference voltage $Vref_{n-1}$, $Vref_{n-2}$, ..., $Vref_0$ based on a maximum reference voltage $V_{max}$. A number of n comparators have each of the positive inputs thereof connected to the analog input and each of the negative inputs thereof connected to a corresponding one of the n reference voltage supply circuits, and each of the outputs of the n comparators generates a corresponding digital data bit of $Q_{n-1}$, $Q_{n-2}$, ..., $Q_0$ respectively. The reference voltages generated by the n reference voltage supply circuits are determined by $$Vref_{n-1}=(\tfrac{1}{2})V_{max}, Vref_{n-2}=[Q_{n-1}(\tfrac{1}{2})+(\tfrac{1}{4})]V_{max}, \ldots Vref_0=[Q_{n-1}(\tfrac{1}{2})+Q_{n-2}(\tfrac{1}{4})+\ldots+Q_1(\tfrac{1}{2}^{n-1})+\tfrac{1}{2}^n]V_{max},$$

with the digital output bits $Q_{n-1}$, $Q_{n-2}$, ..., $Q_0$ being determined as a set of n data bits representing the converted digital data of the input analog signal. Each of the digital output bits $Q_{n-1}$, $Q_{n-2}$, $Q_0$ are fed back to the reference voltage supply circuits for the determination of the output digital bits in a series of time periods.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

wherein $Q_2$, $Q_1$ and $Q_0$ are respectively the three converted output bits with $Q_2$ being the most significant bit (MSB) and $Q_0$ the least (LSB), and $V_{max}$ represents the largest compared voltage.

Based on the above expression, if $Q_2$ was finally determined to be equal to 1, then there is the situation that $V_{in} \geq (\tfrac{1}{2})V_{max}$. If, on the contrary, $Q_2$ equals 0, then $V_{in} < (\tfrac{1}{2})V_{max}$.

Expression (1) can be rearranged to be:

$$V_{in} - Q_2 \frac{1}{2} V_{max} = Q_1 \frac{1}{4} V_{max} + Q_0 \frac{1}{8} V_{max} \quad (2)$$

Thus, if $Q_2=1$, then there is the relationship $V_{in}-Q_2(\tfrac{1}{2})V_{max} < (\tfrac{1}{4})V_{max}$. On the other hand, if $Q_2=0$, then $V_{in}-Q_2(\tfrac{1}{2})V_{max} \geq (\tfrac{1}{4})V_{max}$. In a similar manner, there can be expressed:

$$V_{in} - \left[ Q_2 \frac{1}{2} V_{max} + Q_1 \frac{1}{4} V_{max} \right] = Q_0 \frac{1}{8} V_{max} \quad (3)$$

Based on the above expression, if $Q_0=1$, then $V_{in}[Q_2(\tfrac{1}{2})+Q_1(\tfrac{1}{4})]V_{max} \geq (\tfrac{1}{8})V_{max}$. If $Q_0=0$, then $V_{in}-[Q_2(\tfrac{1}{2})+Q_1(\tfrac{1}{4})]V_{max} < (\tfrac{1}{8})V_{max}$.

Thus, the three digital data bits $Q_2$, $Q_1$ and $Q_0$ can each be identified in a set of mathematical "$\geq$ nd "<" relationships. This is achievable utilizing a set of comparators that determine the value of $Q_2$, $Q_1$ and $Q_0$ for a converted analog input data. Table 1 below summarizes a list of comparing conditions for a three-bit A/D converter.

TABLE 1

| Binary Data $Q_2Q_1Q_0$ | Decimal Value | Range of Analog Voltage | Assuming $V_{max} = 4V$ |
|---|---|---|---|
| 000 | 0 | $0 \leq V_{in} < (\tfrac{1}{8})V_{max}$ | 0~0.5V |
| 001 | 1 | $(\tfrac{1}{8})V_{max} \leq V_{in} < (\tfrac{1}{4})V_{max}$ | 0.5~1V |
| 010 | 2 | $(\tfrac{1}{4})V_{max} \leq V_{in} < (\tfrac{1}{4} + \tfrac{1}{8})V_{max}$ | 1~1.5V |
| 011 | 3 | $(\tfrac{1}{4} + \tfrac{1}{8})V_{max} \leq V_{in} < (\tfrac{1}{2})V_{max}$ | 1.5~2V |
| 100 | 4 | $(\tfrac{1}{2})V_{max} \leq V_{in} < (\tfrac{1}{2} + \tfrac{1}{8})V_{max}$ | 2~2.5V |
| 101 | 5 | $(\tfrac{1}{2} + \tfrac{1}{8})V_{max} \leq V_{in} < (\tfrac{1}{2} + \tfrac{1}{4})V_{max}$ | 2.5~3V |
| 110 | 6 | $(\tfrac{1}{2} + \tfrac{1}{4})V_{max} \leq V_{in} < (\tfrac{1}{2} + \tfrac{1}{4} + \tfrac{1}{8})V_{max}$ | 3~3.5V |
| 111 | 7 | $(\tfrac{1}{2} + \tfrac{1}{4} + \tfrac{1}{8})V_{max} \leq V_{in} < V_{max}$ | 3.5~4V |

Figure 1:
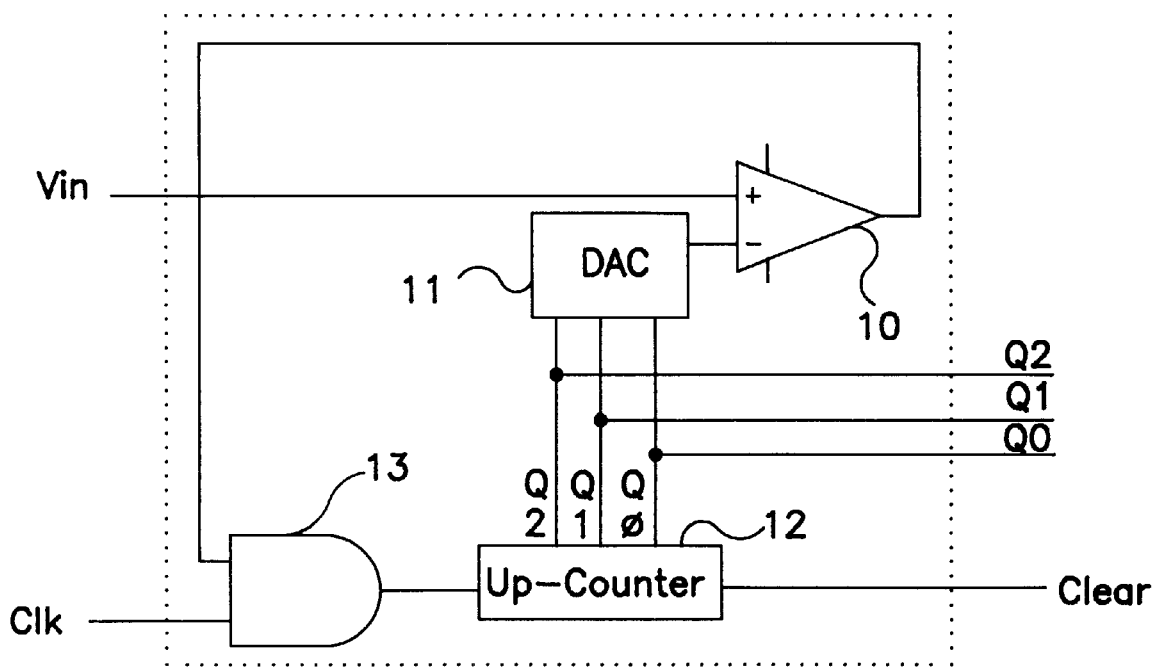
FIG. 1 is a schematic diagram showing the circuitry of a conventional low-speed A/D converter.
Figure 2:
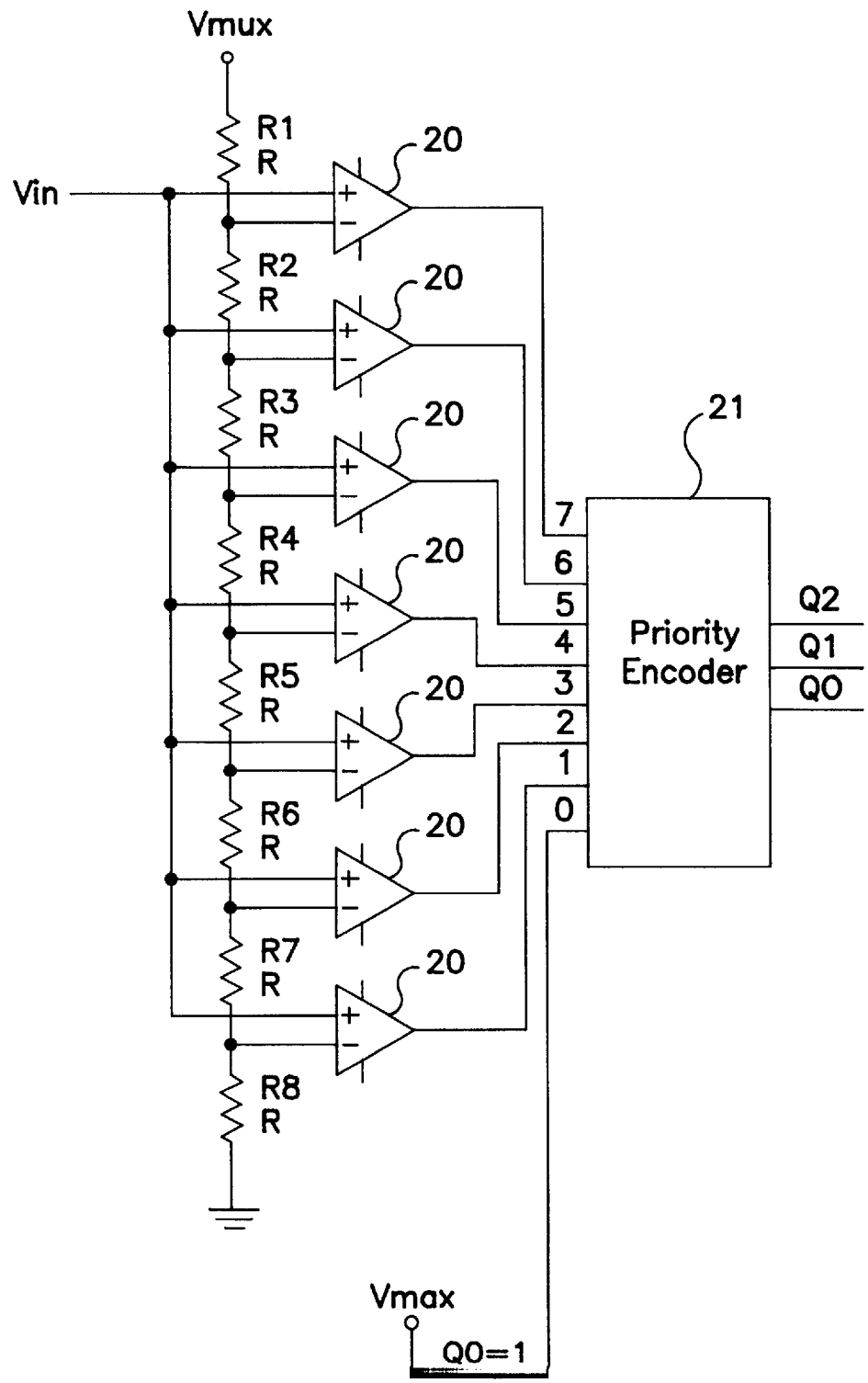
FIG. 2 is a schematic diagram showing the circuitry of a conventional high-speed A/D converter.
Figure 3:
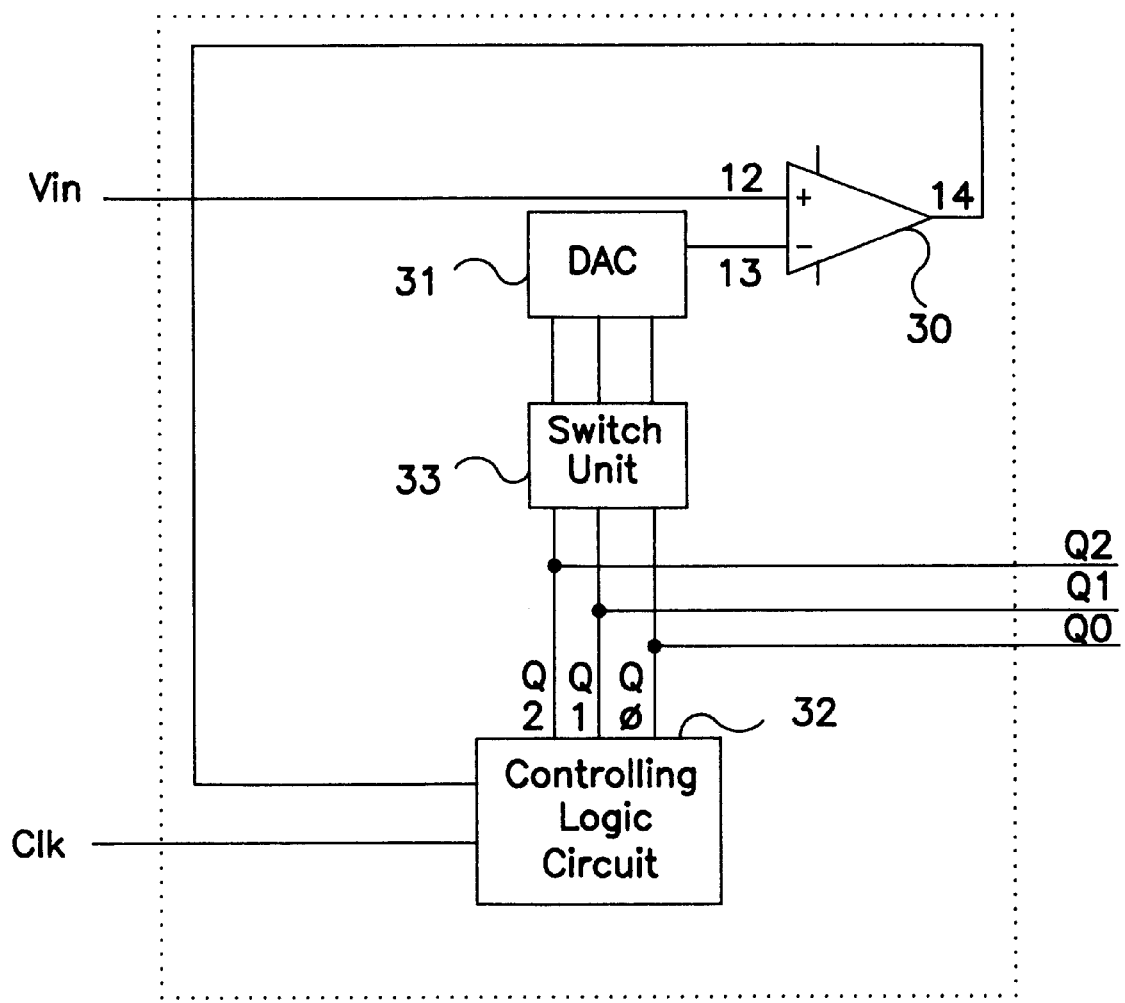
FIG. 3 is a schematic diagram showing the circuitry of another conventional high-speed A/D converter employing a logic control circuitry.
Figure 4A:
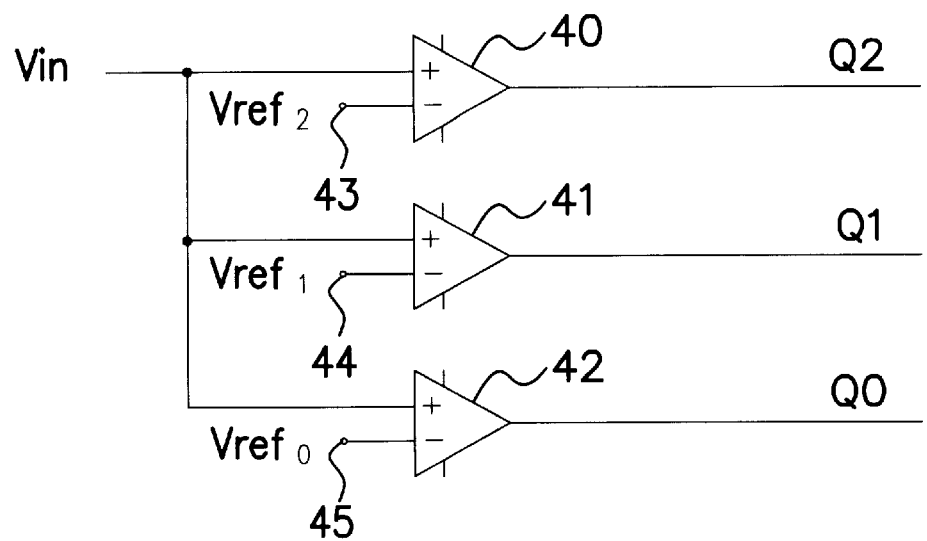
FIG. 4A depicts the basic circuit configuration of the A/D converter constructed in accordance with a preferred embodiment of the invention.
Figure 4B:
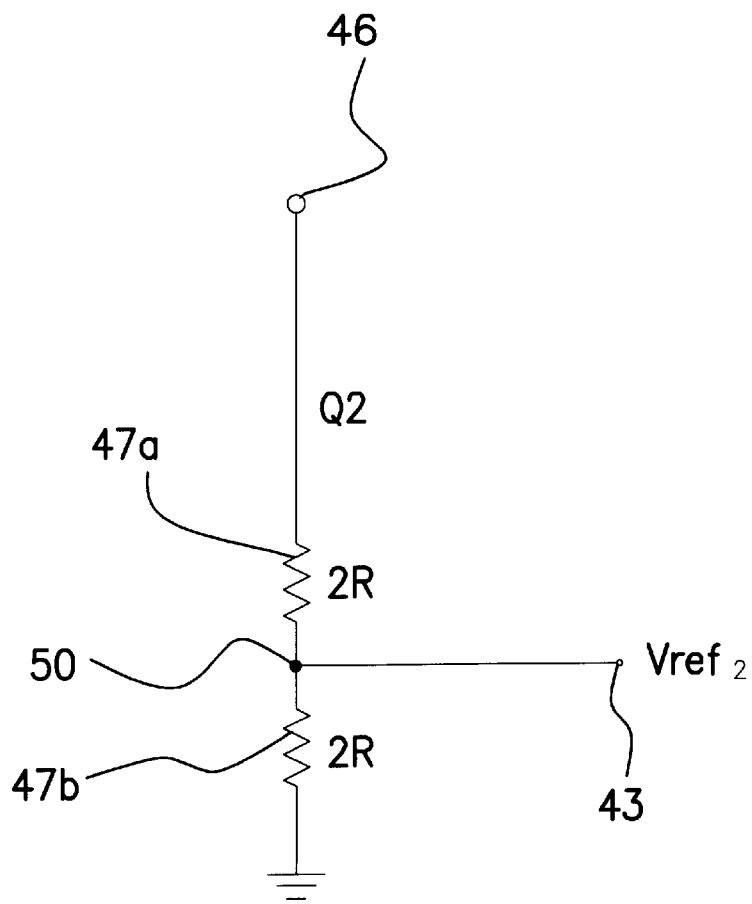
FIGS. 4B–4D respectively show the reference voltage supply circuits for the comparators of the A/D converter of FIG. 4A; and $$V_{in} = Q_2 \frac{1}{2} V_{max} + Q_1 \frac{1}{4} V_{max} + Q_0 \frac{1}{8} V_{max} \quad (1)$$
Figure 4C:
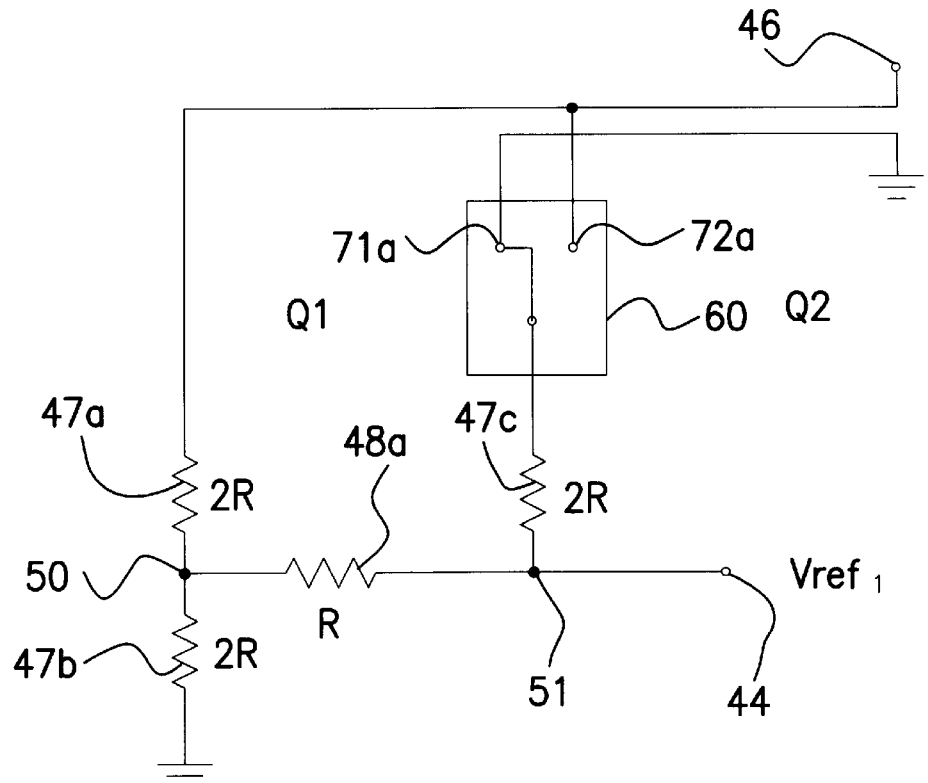
Figure 4D:
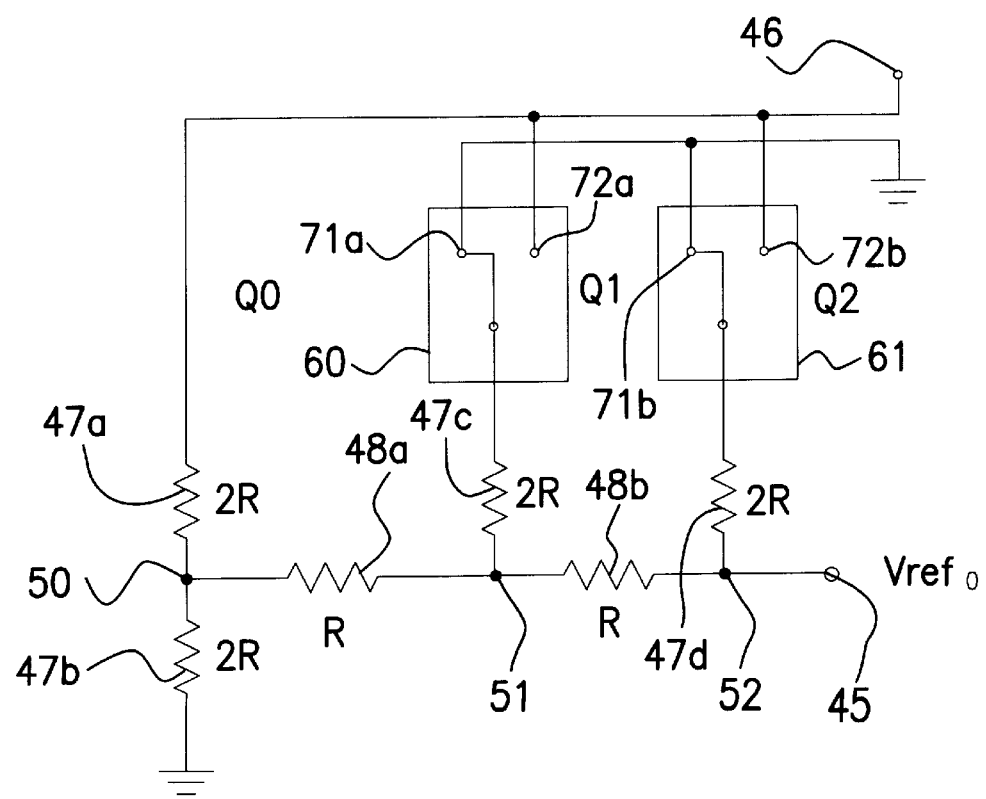
Figure 5:
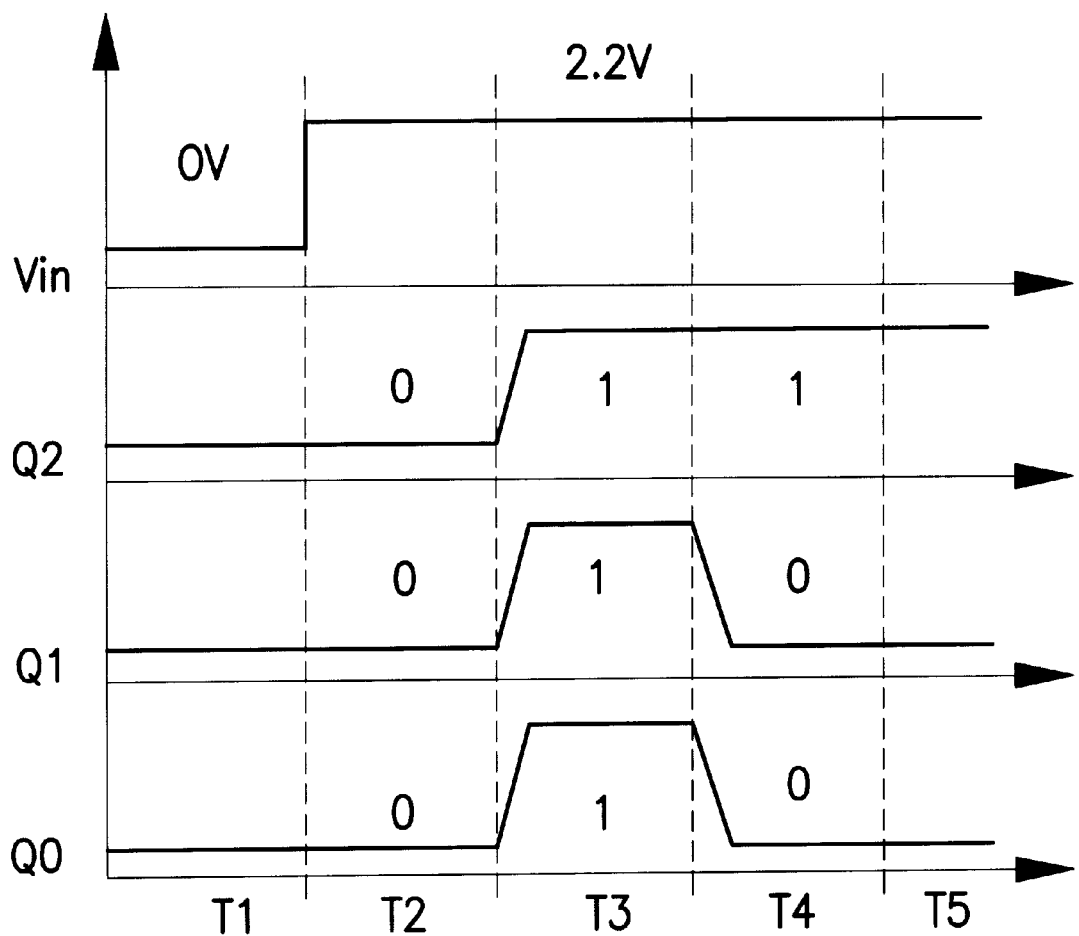

FIG. 5 is a timing diagram showing the timing sequence of obtaining the digital data bits $Q_2$, $Q_1$ and $Q_0$ in the A/D converter based on FIGS. 4A–4D.

DESCRIPTION OF THE PREFERRED EMBODIMENT

For a three-bit A/D converter that converts an analog input signal into a digital representation having a resolution of three bits, there is Refer to FIG. 4A of the drawing, in which a preferred embodiment of the high-speed A/D converter of the invention is shown in its schematic diagram. This is an embodiment of a three-bit A/D converter that includes an array of three comparators 40, 41 and 42. All the positive inputs of the three comparators are tied together and fed by the same analog input signal $V_{in}$ to be converted into digital data. Each negative input 43, 44 and 45 of these three comparators 40, 41 and 42 is supplied with a corresponding reference voltage respectively. Each of the compared output of these three comparators 40, 41 and 42 is used as the digitally-converted output bits $Q_2$, $Q_1$ and $Q_0$ respectively to represent the data in the order of MSB down to LSB.

Each of the three comparators 40, 41 and 42 of the three-bit A/D comparator exemplified herein has its negative input fed by a corresponding reference voltage source $Vref_2$, $Vref_1$ and $Vref_0$ respectively. These reference voltages are used by the comparators 40, 41 and 42 to implement their respective comparison with the input analog signal $V_{in}$ relayed to their positive input ends. Each of the reference voltage sources for comparators 40, 41 and 42 is outlined in the reference voltage circuitry of FIGS. 4B, 4C and 4D respectively.

With simultaneous reference to FIGS. 4A and 4B, it is illustrated that the first comparator 40 of the three-bit comparator has its reference voltage source $Vref_2$ supplied to the negative input by the first reference voltage supply circuit as outlined in the schematic diagram of FIG. 4B. This first reference voltage supply circuit has a pair of resistors 47a and 47b connected in series across the maximum reference voltage $V_{max}$ supplied at node 46 and the system ground potential (GND). The junction 50 where the two resistors 47a and 47b are connected together is the node that supplies the reference voltage $Vref_2$, which, in the case of the comparator 40 of FIG. 4A, is the node 43. Each of the two resistors 47a and 47b have the same resistance value of 2R.

FIG. 4C shows the second reference voltage supply circuit for supplying reference voltage $Vref_1$ to the second comparator 41 of the three-bit A/D converter of FIG. 4A. This second reference voltage supply circuit can be envisioned to be built based on the circuit of FIG. 4B. Based on the first reference voltage supply circuit, a 2-to-1 switch 60 has its common terminal connected to the junction node 50 of the two resistors 47a and 47b via a 2R resistor 47c and a 1R resistor 48a. As is in the case of the first reference voltage supply circuit, the two resistors 47a and 47b are connected in series and tied between the node 46 that supplies the maximum reference voltage $V_{max}$ and the system ground potential GND. The junction node 51 between the resistors 47c and 48a is the node, namely node 44, that supplies the second reference voltage $Vref_1$ to the second comparator 42 of FIG. 4A. The first of the two switched terminals, 71a, of the switch 60 is tied directly to ground, while the second switched terminal, 72a, is connected to node 46, the maximum reference voltage supply node.

FIG. 4D shows the third reference voltage supply circuit for supplying the third reference voltage $Vref_0$ to the third comparator 42 of the three-bit A/D converter of FIG. 4A. In a similar manner, this third reference voltage supply circuit can be envisioned to be built based on the circuit of FIG. 4B, or, further based on the circuit of FIG. 4C. Based on the second reference voltage supply circuit, a 2-to-1 switch 61 has its common terminal connected to the junction node 50 of the two resistors 47a and 47b via a 2R resistor 47d, a 1R resistor 48b, and the 1R resistor 48a of the second reference voltage supply circuit. As is in the case of the first reference voltage supply circuit, the two resistors 47a and 47b are connected in series and tied between the node 46 that supplies the maximum reference voltage $V_{max}$ and the system ground potential GND. The junction node 52 between the resistors 47d and 48b is the node, namely node 45, that supplies the third reference voltage $Vref_0$ to the third comparator 42 of FIG. 4A. The first of the two switched terminals, 71b, of the switch 61 is tied directly to the ground, while the second switched terminal, 72b, is connected to node 46, the maximum reference voltage supply node.

If the A/D converter of the invention requires a resolution of more than three bits, more reference voltage supply circuits than the first, second and third for the converter of FIG. 4A can be installed. A fourth reference voltage supply circuit can be built based on the third of FIG. 4D, and a fifth based on the fourth, and so on. For an n-bit A/D converter, in addition to the n comparators required, the n-th reference voltage supply circuit is basically one that is similar to that depicted in FIGS. 4C and 4D, with a total of n-1 2-to-1 switches installed in its resistor network.

A description of the A/D conversion performed by the three-bit A/D converter outlined in FIGS. 4A–4D follows. In the comparator array of the converter as illustrated in FIG. 4A, an analog input signal $V_{in}$ input to all the comparators 40, 41 and 42 are required to be converted into a three-bit eight-grade digital data represented by the three bits $Q_2$, $Q_1$ and $Q_0$, with $Q_2$ being the MSB and $Q_0$ the LSB.

The first reference voltage $Vref_2$ at node 43 for comparator 40 can be expressed as $$Vref_2 = [2R/(2R+2R)] \times V_{max} = (½)V_{max}$$

while the second reference voltage $Vref_1$ at node 44 expressed as $$Vref_1 = Q_2 \times (½)V_{max} + (¼)V_{max}$$

In case $Q_2=0$, which indicates a situation wherein the input analog signal falls in the range under ½ $V_{max}$, then the switch 60 for the second reference voltage circuit in FIG. 4C is switched to ground GND. Based on Thevenin theorem, the second reference voltage $Vref_1$ at node 44 becomes $(¼)V_{max}$. On the other hand, if $Q_2=1$, which means $V_{in} > ½ V_{max}$, then the switch 60 is switched to $V_{max}$ at node 46, and the second reference voltage $Vref_1$ at node 44 becomes $(½+¼)V_{max} = (¾)V_{max}$ based on the rule of superimposition of two voltages. In this case, $Q_2$ is the factor to determine whether or not to superimpose the two voltages.

In a similar manner, the third reference voltage $Vref_0$ at node 45 can be determined to be:

$$Vref_0 = Q_2 \times (½)V_{max} + Q_1 \times (¼)V_{max} + (⅛)V_{max}$$

At the initial state of the circuitry, the analog input signal $V_{in}$ is compared simultaneously at the three-comparators 40, 41 and 42 with their corresponding reference voltages $Vref_2$, $Vref_1$ and $Vref_0$ being present at nodes 43, 44 and 45 respectively. At this stage, the MSB $Q_2$ is stabilized to a fixed value. Then, the analog input signal $V_{in}$ is compared with the value $(½)V_{max}$, regardless of the status of the other two bits $Q_1$ and $Q_0$. Then, the value of $Q_1$ can be determined based on a stabilized $Q_2$ value. $Q_0$ can be obtained in a similar manner. During this process, the status of the two bits $Q_2$ and $Q_1$ determines the switched position of the switches 60 and 61 in the reference voltage circuits of FIGS. 4C and 4D.

In general, in an A/D converter of the invention featuring a conversion resolution of n bits, there can be the following relationships for the determination of the reference voltages at each of the reference voltage supply circuit stages:

$$Vref_{n-1} = (½)V_{max}, Vref_{n-2} = [Q_{n-1}(½) + (¼)]V_{max}, \ldots Vref_0 = [Q_{n-1}(½) + Q_{n-2}(¼) + \ldots + Q_1(½^{n-1}) + ½]V_{max}$$

and the digital output bits $Q_{n-1}$, $Q_{n-2}$, ..., $Q_0$ as converted being determined as a set of n data bits representing the converted digital data of the input analog signal. In the process of conversion to be described in the following paragraphs, each of the digital output bits $Q_{n-1}$, $Q_{n-2}$, ..., $Q_0$ are fed back to the reference voltage supply circuits for the determination of the output digital bits in a series of time periods.

For example, consider the timing diagram of FIG. 5, in which the timing sequence of obtaining the digital data bits $Q_2$, $Q_1$ and $Q_0$ are outlined. Assuming an analog input signal $V_{in}$ rises from 0 to 2.2 V instantaneously at the end of time period T1. As a result, the $Q_2$, $Q_1$ and $Q_0$ sequence changes from 000 to 100 (decimal 4). As the input analog voltage increases from 0 to 2.2 V, the first reference voltage $Vref_2$ at node 43 becomes 2 V, that is, $(\frac{1}{2})V_{max}=(\frac{1}{2})\times 4$ V=2 V. Thus, the MSB $Q_2$ is set equal to 1 at this instance. Then, the second reference voltage $Vref_1$ at node 44 can be determined to be 3 V, since $Q_2\times(\frac{1}{2})V_{max}+(\frac{1}{4})V_{max}=1\times(\frac{1}{2})\times 4$ V+$(\frac{1}{4})\times 4$ V=3 V. And, thus, the bit $Q_1$ is set equal to 0 at this time. Finally, for $Q_0$, the third reference voltage $Vref_0$ at node 45 can be determined to be 2.5 V, since $Q_2\times(\frac{1}{2})V_{max}+Q_1\times(\frac{1}{4})V_{max}+(\frac{1}{8})V_{max}=1\times(\frac{1}{2})\times 4$ V+$0\times(\frac{1}{4})\times 4$ V+$(\frac{1}{8})\times 4$ V=2.5 V. The LSB $Q_0$ can be determined to be 0 at this instance. Thus, the converted digital data of the 2.2 V analog input signal can be expressed as $Q_2Q_1Q_0$=100 (decimal 4).

In FIG. 5, $V_{in}$ represents the input analog signal expressed as a function of time. In the time period T1, $V_{in}$ is in its 0 V stage, and its corresponding steady-state digital representation $Q_2Q_1Q_0$ is 000 (0). In the time period T2, input analog signal $V_{in}$ rises from 0 to 2.2 V. During this period, due to the processing delay in the comparators, the $Q_2Q_1Q_0$ outputs still remained at 000. At this stage, the procedure for the determination of the values of the $Q_2$, $Q_1$ and $Q_0$ sequence is initiated, in which the first reference voltage $Vref_2$ at node 43 is found to be equal to 2 V, the second reference voltage $Vref_1$ at node 44 equal to 1 V, and the third reference voltage $Vref_0$ at node 45 equal to 0.5 V. Thus, as the time proceeds to T3 after the processing delays in the T2 period in the comparators, it is established that there is the relationship $V_{in}>Vref_1>Vref_2>Vref_3$, and there is therefore the intermediate result of $Q_2=1$, $Q_1=1$ and $Q_0=1$. Based on this set of intermediate result, as the time proceeds to T4, it can be determined during the time period T3 that $Vref_1=2$ V, $Vref_2=3$ V, and $Vref_3=3.5$ V. This implies that $Q_1$ and $Q_0$ be changed into 0 and 0 respectively. This in turn changes $Vref_3$ into 2.5 V, sustaining $Q_0$ at the value 0. This concludes the processing of the A/D conversion, with the final result of $Q_2Q_1Q_0$=100, as is illustrated in the time diagram at the conclusion of the T4 period.

Thus, it is apparent that the processing delay time is vastly shorter than that required by the prior-art circuitry. Assuming a 100 ns delay time for each processing stage, in a three-bit A/D converter, the total processing time required is 100 ns×3=300 ns. This is about only one half that required by the prior-art circuitry. In general, the overall processing time required by the A/D converter of the invention is linearly proportional to the number of comparators, namely the number of data bits employed in the converter. Meanwhile, in addition to the advantageously faster processing time, there is the additional benefit of the fact that no complicated control logic circuitry is required to implement the A/D conversion operation of the invention. Further, the circuitry of the A/D converter of the invention requires no timing clock circuitry to synchronize the processing operation. All these advantages contribute to the cost reduction of the A/D converter of the invention when compared to the prior art.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An analog-to-digital converter apparatus for converting an input analog signal into an n-bit digital data represented by binary data bits $Q_{n-1}$, $Q_{n-2}$, ..., $Q_0$ with $Q_{n-1}$ being the most significant bit and $Q_0$ the least, the converter comprising:

a plurality of n reference voltage supply circuits each generating a corresponding reference voltage $Vref_{n-1}$, $Vref_{n-2}$, ..., $Vref_0$ based on a maximum reference voltage $V_{max}$, and each of the n reference voltage supply circuits being connected across the maximum reference voltage and the system ground potential, wherein a first of the n reference voltage supply circuits is a first resistor network that includes a first series-resistor network having two resistors connected in series, with one terminal of the first series-resistor network connected to the maximum reference voltage and the other terminal of the first series-resistor network connected to a system ground potential, and a junction between the tow resistors of the first series-resistor network supplying the first voltage $Vref_{n-1}$; and a second of the n reference voltage supply circuits is a second resistor network that includes a first series-resistor network for the first of the n reference voltage supply circuits, a second series-resistor network having two resistors connected in series, with one terminal of the second series-resistor connected to the junction of the first series-resistor network supplying the first reference voltage, and the other terminal thereof connected to the common terminal of a 2-to-1 switch means, the first switched terminal of the switch means being connected to the system ground potential, and the second switched terminal to the maximum reference voltage, with a junction between the two resistors of the second series-resistor network supplying the second reference voltage $V_{ref_{n-2}}$ a plurality of n comparators having each of the positive inputs thereof connected to the analog input and each of the negative inputs thereof connected to a corresponding one of the n reference voltage supply circuits, and each of the outputs of the plurality of n comparators generating a corresponding digital data bit of $Q_{n-1}$, $Q_{n-2}$, ..., $Q_0$ respectively;

wherein the reference voltages generated by the plurality of n reference voltage supply circuits are determined by $Vref_{n-1}=(\frac{1}{2})V_{max}$, $Vref_{n-2}=[Q_{n-1}(\frac{1}{2})+(\frac{1}{4})]V_{max}$, $Vref_0=[Q_{n-1}(\frac{1}{2})+Q_{n-2}(\frac{1}{4})+ \ldots +Q_1(\frac{1}{2}^{n-1})+\frac{1}{2}^n]V_{max}$ and the digital output bits $Q_{n-1}$, $Q_{n-2}$, ..., $Q_0$ being determined as a set of n data bits representing the converted digital data of the input analog signal, wherein each of the digital output bits $Q_{n-1}$, $Q_{n-2}$, ..., $Q_0$ are fed back to the reference voltage supply circuits for the determination of the output digital bits in a series of time periods.

2. The analog-to-digital converter apparatus according to claim 1, wherein each of the plurality of n reference voltage supply circuits comprises a resistor network connected across the maximum reference voltage and the system ground potential, wherein the first of the plurality of the n reference voltage supply circuits is a first resistor network that includes a first series-resistor network having two resistors connected in series, with one terminal of the first series-resistor network connected to the maximum reference voltage and the other terminal of the first series-resistor network connected to system ground potential, and the junction between the two resistors of the first series-resistor network supplying the first reference voltage $Vref_{n-1}$.

3. The analog-to-digital converter apparatus according to claim 2, wherein the two resistors of the first series-resistor network have the same resistance value.

4. The analog-to-digital converter apparatus according to claim 1, wherein the two resistors of the first series-resistor network has the same resistance value, the first of the second series-resistor network connected to the first series-resistor network has a resistance value that is half that of the resistors of the first series-resistor network, and the second of the second series-resistor network connected to the first switch means has resistance value that the same as resistors of the first series-resistor network.

5. The analog-to-digital converter apparatus according to claim 1, wherein each of the plurality of n reference voltage supply circuits is connected across the maximum reference voltage and the system ground potential, wherein the first of the plurality of the n reference voltage supply circuits is a first resistor network that includes a first series-resistor network having two resistors connected in series, with one terminal of the first series-resistor network connected to the maximum reference voltage and the other terminal of the first series-resistor network connected to system ground potential, and the junction between the two resistors of the first series-resistor network supplying the first reference voltage $Vref_{n-1}$;

the second of the plurality of the n reference voltage supply circuits is a second resistor network that includes a first resistor network for the first of the plurality of the n reference voltage supply circuits, a second series-resistor network having two resistors connected in series, with one terminal of the second series-resistor connected to the junction of the first series-resistor network supplying the first reference voltage, and the other terminal thereof connected to the common terminal of a first 2-to-1 switch means, the first switched terminal of the first switch means being connected to the system ground potential, and the second switched terminal to the maximum reference voltage, with the junction between the two resistors of the second series-resistor network supplying the second reference voltage $Vref_{n-2}$; and the n-th of the plurality of the n reference voltage supply circuits is an n-th resistor network that includes an n-1-th resistor network for the n-1-th of the plurality of the n reference voltage supply circuits, an n-th series-resistor network having two resistors connected in series, with one terminal of the n-th series-resistor connected to the junction of the n-1-th series-resistor network supplying the n-1-th reference voltage, and the other terminal thereof connected to the common terminal of an n-1-th 2-to-1 switch means, the first switched terminal of the n-1-th switch means being connected to the system ground potential, and the second switched terminal to the maximum reference voltage, with the junction between the two resistors of the n-th series-resistor network supplying the n-th reference voltage $Vref_0$.

6. The analog-to-digital converter apparatus according to claim 5, wherein the two resistors of the first series-resistor network have the same resistance value, the first of the second series-resistor network connected to the first series-resistor network has a resistance value that is half that of the resistors of the first series-resistor network, the second of the second series-resistor network connected to the first switch means has resistance value that is the same as resistors of the first series-resistor network, the first of the n-th series-resistor network connected to the n-1-th series-resistor network has a resistance value that is half that of the resistors of the first series-resistor network, and the second of the n-th series-resistor network connected to the n-1-th switch means has resistance value that is the same as resistors of the first series-resistor network.

* * * * *

UNITED STATES PATENT AND TRADEMARK OFFICE
CERTIFICATE OF CORRECTION

PATENT NO. : 6,040,794
DATED : March 21, 2000
INVENTOR(S) : Jerry Jaw It is certified that error appears in the above-identified patent and that said Letters Patent is hereby corrected as shown below:

In column 4, line 17, delete "then $V_{in}[Q_2$" and insert -- $V_{in}$—[$Q_2$ --.

Signed and Sealed this

Twenty-fourth Day of April, 2001

Attest:

NICHOLAS P. GODICI

Attesting Officer

Acting Director of the United States Patent and Trademark Office